US006661251B1

(12) United States Patent
Dowen et al.

(10) Patent No.: US 6,661,251 B1

(45) Date of Patent: Dec. 9, 2003

(54) INTERFACE CIRCUIT

(75) Inventors: Brett Leslie Dowen, 3 Manor Rise, Lichfield, Staffordshire WS14 9SL (GB); Simon Brooks Clarke, Staffordshire (GB)

(73) Assignee: Brett Leslie Dowen, Staffordshire (GB)

( * ) Notice: Subject to any disclaimer, the term of this patent is extended or adjusted under 35 U.S.C. 154(b) by 0 days.

(21) Appl. No.: 09/937,075

(22) PCT Filed: Mar. 24, 2000

(86) PCT No.: PCT/GB00/01133

§ 371 (c)(1), (2), (4) Date: Sep. 20, 2001

(87) PCT Pub. No.: WO00/57342

PCT Pub. Date: Sep. 28, 2000

(30) Foreign Application Priority Data

Mar. 24, 1999 (GB) ............................................. 9906661

(51) Int. Cl.[7] ............................................. H03K 19/173

(52) U.S. Cl. ............................................. 326/37; 326/62

(58) Field of Search ............................. 326/56, 62, 82, 326/37, 38

(56) References Cited

U.S. PATENT DOCUMENTS

| | | | | |
|---|---|---|---|---|
| 4,839,812 A | | 6/1989 | Nusser et al. | |
| 5,107,146 A | | 4/1992 | El-Ayat | |
| 6,025,742 A | * | 2/2000 | Chan | 327/108 |

FOREIGN PATENT DOCUMENTS

| | | |
|---|---|---|
| FR | 2 637 396 | 4/1990 |
| GB | 2 251 766 | 7/1992 |
| GB | 2 322 715 | 9/1998 |

* cited by examiner

*Primary Examiner*—Daniel Chang

(74) *Attorney, Agent, or Firm*—Smith-Hill and Bedell

(57) ABSTRACT

A signal interface circuit (10) having a terminal (14) for connection to a simulator system indicated schematically at (16), and a terminal (18) for connection to a system under test, indicated generally at (20). The simulator system may, for instance, be a PC based software simulation and the system under the test may, for instance, be an engine management system. The circuit (10) provides a reconfigurable interface between the systems (16, 20), allowing analog or digital signals to pass in either direction, in accordance with the configuration of the circuit (10).

16 Claims, 2 Drawing Sheets

INTERFACE CIRCUIT

The present invention relates to interface circuits and in particular, but not exclusively, to interface circuits for use within simulation techniques.

It is increasingly common to test engineering systems by simulation. For instance, the operation of an electronic system such as an engine management system may be tested under a wide range of conditions by providing signals representing those conditions, and recording the response of the engine management system under those simulated conditions. This allows a very wide range of conditions to be simulated, possibly including situations which are unlikely to arise in practice, or would be dangerous or difficult to create in a real life test. Simulation signals to the system under test can readily be generated by computer or from computer based circuitry. However, the signals readily available in this form (particularly signal voltages, currents and loadings) may not be the same as those which would be experienced in real life by the system under test. In the past, the flexibility of simulation available from a computer controlled system has thus been hampered by the need to design and build an interface circuit specific to the requirements of the simulation system and the system under test. The cost and delay involved in doing so can represent a significant hindrance to the test procedure.

The present invention provides a signal interface circuit comprising circuit portions operable to provide a digital interface, and circuit portions operable to provide an analogue interface, the circuit further comprising control means operable selectively to enable or disable the said circuit portions, whereby to reconfigure the interface.

The circuit portions may be individually selectable to configure the circuit as a digital or analogue device. The circuit may comprise circuit portions operable to provide an input interface and circuit portions operable to provide an output interface.

The circuit preferably comprises a plurality of switch means operable to reconfigure the interface by connecting and disconnecting corresponding circuit portions. The switch means may comprise analogue switches. The state of the switch means is preferably determined by data supplied by the control means. The said data is preferably binary data which sets the state of the switch. The control means may comprise storage means storing data bits which set the state of the switch means. The storage means may comprise a shift register. The control means may comprise a data input port operable to receive control data for storage in the storage means. The data input port is preferably a serial data port.

The circuit may form part of an array of like circuits, each providing a respective interface channel. The storage means of the circuits are preferably connected in series to allow control data to be passed from circuit to circuit. The storage means of the circuits may alternatively be connected in parallel.

The circuit preferably comprises circuit portions operable to provide a digital input interface. The digital input interface preferably includes a threshold detector and may optionally incorporate a buffer circuit, a filter circuit or a variable gain amplifier.

The circuit preferably comprises circuit portions operable to provide an analogue input interface. The analogue input interface preferably comprises a buffer amplifier and may optionally incorporate a variable gain amplifier or a filter circuit.

Preferably the circuit further comprises a load connectable between a terminal on which an input signal is received, and a power rail. Preferably the load is connectable selectively to a high or low power rail, whereby to apply a loading to the input signal. The voltage of the power rail may be selectively configurable to be at one of a plurality of predetermined voltage levels. The power rail is preferably configurable in response to data received from the control means.

Preferably the circuit comprises circuit portions operable to provide a digital output interface to an output terminal. The circuit portions may comprise two switches connected between the output terminal and, respectively, the low and high logic levels, the switches being closable to pull the output terminal to the corresponding logic level, the switch to be closed being selected in accordance with the logic level of the signal received. The circuit portions may further comprise a load connectable between the output terminal and, selectively, the low and high logic levels, to load the output terminal. Operation of the switches may be selectively disabled by the control means, whereby the output is either pulled to a selected logic level or loaded by the said load.

Preferably the circuit comprises circuit portions operable to provide an analogue output interface. The analogue output interface may incorporate an amplifier, such as a buffer amplifier, and may optionally incorporate a variable gain amplifier and/or a filter circuit.

The invention also provides a multi-channel signal interface system comprising a plurality of circuits as aforesaid, each providing an interface between a simulation system and a system under test, the simulation system being operable to provide signals in accordance with a simulation being conducted and to receive signals indicative of the response of the system under test, the signals being provided and received through the interface circuits, and the interface circuits being individually reconfigurable as aforesaid.

Embodiments of the present invention will now be described in more detail, by way of example only, and with reference to the accompanying drawings, in which:

FIG. 1 shows a signal interface circuit 10 comprising various circuit portions to be described, operable to provide a digital interface, and various circuit portions to be described, operable to provide an analogue interface. The circuit further comprises control means indicated generally at 12, and operable selectively to enable or disable the circuit portions, to reconfigure the interface.

In more detail, the circuit 10 has a terminal 14 for connection to a simulator system indicated schematically at 16, and a terminal 18 for connection to a system under test, indicated generally at 20. The simulator system may, for instance, be a PC based software simulation and the system under test may, for instance, be an engine management system. The circuit 10 provides a reconfigurable interface between the systems 16,20, allowing analogue or digital signals to pass in either direction, in accordance with the configuration of the circuit 10.

Figure 1:
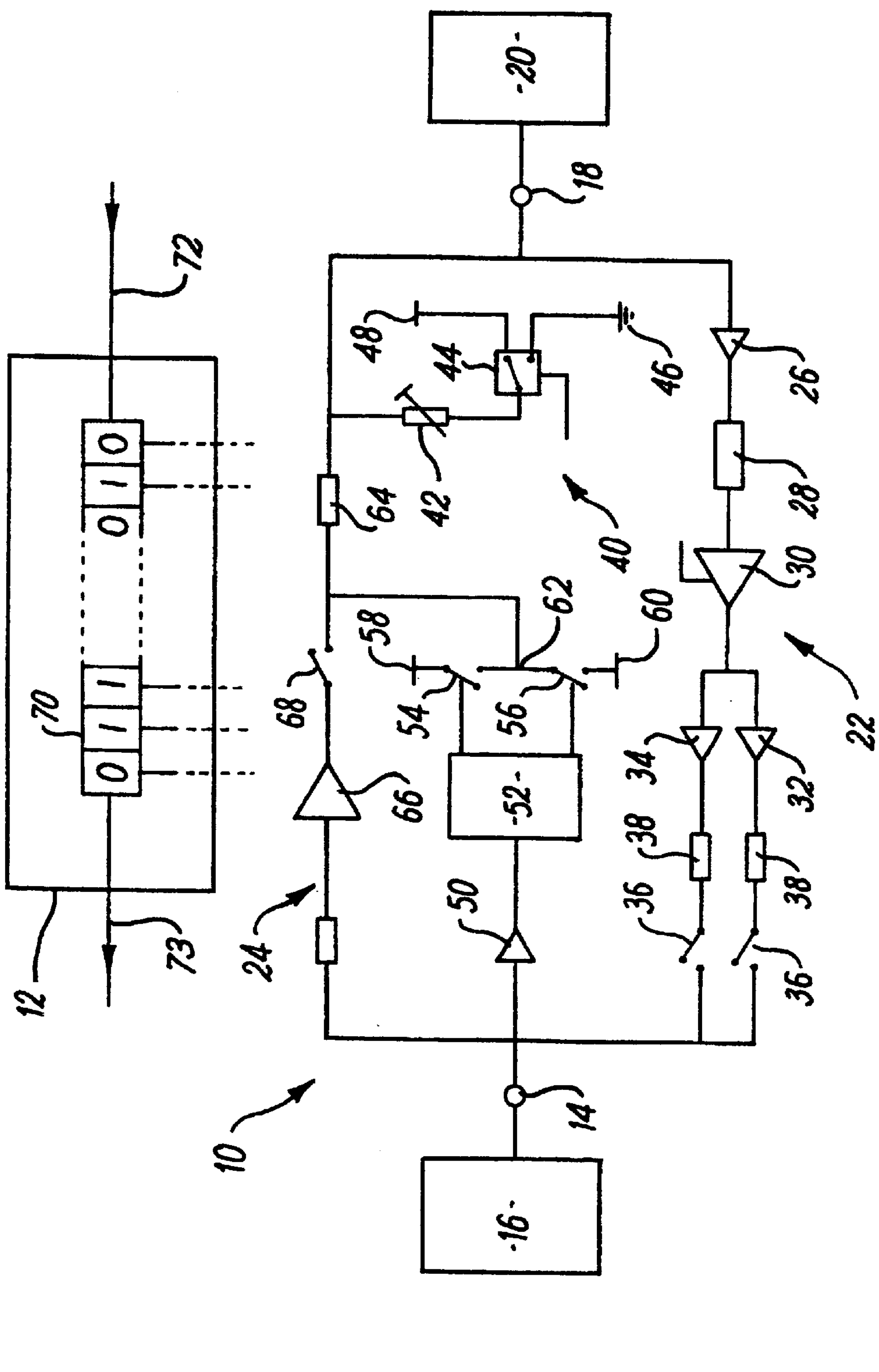
FIG. 1 is a schematic circuit diagram of a signal interface circuit according to the present invention.

In the schematic of FIG. 1, the circuit 10 broadly divides into a lower limb 22 for use as an input interface for the system 16, and an upper limb 24 for use as an output interface for the system 16.

The lower limb 22 incorporates a buffer 26 for receiving signals from the terminal 18 (acting as an input terminal) and is followed in series by a filter 28 and then by a variable gain amplifier 30. The output of the amplifier 30 is applied in parallel to a digital threshold detector or gate 32 and an analogue buffer circuit 34. The gate 32 and buffer 34 can be switched into or out of circuit by switches 36, controlled by the control means 12. The switches 36, when closed, connect the outputs of the gate 32 and buffer 34 through to the terminal 14, acting as the output of the circuit 10. If required, protection 38 may be provided between the gate 32 and buffer 34, such as fuse protection.

The gain of the amplifier 30 is controlled by the control means 12.

When the gate 32 is switched into circuit and the buffer 34 is switched out of circuit, the lower limb 22 acts as a digital input interface, as follows. A signal received at 18 is first buffered at 26 and filtered at 28, before being amplified at 30 and applied to the gate 32 for threshold detection. It is desirable that the output of the gate 32 is at conventional logic levels (such as TTL logic levels) so that the output of the gate 32, available through the terminal 14, can be used directly by the simulator 16, without further processing or interface requirements.

In this example, the gate 32 has a fixed detector threshold but the input to the gate 32 is amplified by the amplifier 30, which in turn has variable gain control, so that the effective threshold within the input signal at which the gate 32 will change state, can be selected by variation of the gain control of the amplifier 30.

The circuit 10 therefore can be configured to provide a versatile digital input interface.

When the switches 36 connect the buffer 34 into circuit, and the gate 32 out of circuit, the lower limb 22 acts as an analogue input interface, as follows.

The signal received at 18 from the system 20 under test is first buffered at 26, filtered at 28 and amplified (with variable gain) at 30, as has been described. The output of the amplifier 30 is applied to the buffer 34, which is a fixed gain analogue buffer providing an analogue output at a voltage level required within the simulator system 16, so that the output of the buffer 34 can be used directly by the system 16. However, although the gain of the buffer 34 is fixed, the overall gain of the interface is variable by setting the gain of the amplifier 30.

It will be apparent from the above that many other arrangements for buffering, filtering or otherwise treating the signals can be incorporated within the lower limb 22, as required by the particular application to which the circuit is intended to be put, but the circuit shown in FIG. 1, although simple, is expected to be sufficiently versatile to deal with a very wide range of practical situations, and can thus be considered "universal".

The operation of the circuit 10 as an input interface can be further modified by a controlled load arrangement indicated generally at 40.

A controlled load 42 (illustrated as a variable resistance but alternatively of any form of variable impedance) is connected at one side to the terminal 18 and at the other side to a switch 44 to connect the load 42 to ground at 46 or the positive rail at 48, according to the state of the switch 44. Although not illustrated, the switch 44 preferably has a further state in which the load 42 is connected neither to ground 46 nor to the positive rail 48 and is thus effectively out of circuit.

The load 42 can therefore be introduced into the circuit to apply a loading to the signal received at 18, either loading the signal to ground or to the positive rail, according to the setting of the switch 44, with the degree of loading being set by the setting of the variable load 42.

The use of the circuit 10 as an output interface, for signals passing from the simulator system 16 to the system 20 under test, can now be described with reference to the upper limb 24. During use as an output interface, signals are received from the simulator system 16 at 14 and may be either analogue or digital, and are passed to the system 20 at 18.

A digital output signal is applied from the terminal 14 to a buffer 50 and then to a switch control circuit 52 able to open or close switches 54,56. The switches 54,56 are connected in series between logic high at 58 and logic low at 60 and are tapped at their common terminal 62 to provide the output to the terminal 18, through optional protection such as an electronic fuse 64.

The switches 54,56 and the switch control circuit 52 have two modes of operation. In the first, the switch control circuit 52 will close one and open the other of the switches 54,56 in accordance with the digital state of the signal received from the buffer 50. The terminal 18 is thus pulled to logic high or logic low according to the state of the switches 54,56. This provides a true digital signal at the terminal 18 (i.e. a signal which is always either logic high or logic low). It is important to note that the logic high and logic low levels are set by the voltages at 58,60 which are independent of the inputs received at 14 and can be set by the control means as part of the configuration of the circuit. Thus, the circuit 10 could receive digital signals at conventional logic levels, such as TTL levels, but is able to provide output logic levels at voltages set independently of the input logic levels and of each other. This enhances the versatility of the interface arrangement.

The second mode of operation of the switches 54,56 and circuit 52 makes use of the controlled load 40. The load 40 can be connected into circuit at the terminal 18, as has been described. When so connected, the switch control circuit 52 will open and close one of the switches 54,56, but leave the other switch 54,56 open. For instance, the circuit 52 may open or close the switch 54, connecting to logic high 58, so that the terminal 18 is pulled hard to logic high when the switch 54 is closed, but is connected through the load 42 to the positive rail 48 or ground 46 when the switch 54 is open, according to the setting of the switch 44. This allows the output to be in the form of a signal which is either held hard to logic high, or allowed to decay at a rate controllable by the setting of the variable load 42.

Similarly, the switch control circuit 52 could operate the switch 56, leaving the switch 54 open. This would hold the terminal 18 hard to logic low when the switch 56 is closed, with decay again being provided through the load 42.

The mode of operation can be set by instructions received by the circuit 52 from the control means 12. The circuit 10 can therefore be configured to provide a variety of digital output interfaces from the simulator 16 to the system 20.

When operating as an analogue output interface, analogue signals received at 14 are applied to a fixed gain amplifier 66, switched into or out of circuit by an switch 68. When in circuit, the output of the amplifier 66 is applied to the terminal 18, through the electronic fuse 64 if present.

It is envisaged that the amplifier 66 could be a variable gain amplifier, but the simulator 16 can change the amplitude of the analogue voltage at 14 to change the amplitude at 18. It is therefore envisaged that if the amplifier 66 is capable of driving to supply rail voltages in either direction, the variable gain for the amplifier 66 is unnecessary.

The load 40 can be used to provide loading, as described above, when the circuit 10 is providing an analogue interface.

It is apparent from the above description that the configuration of the circuit 10 is readily changed, being set by the various switches 36,44,52 and 68. The setting of these switches is determined by the control means 12. The control means is in the form of a shift register 70 containing data bits which determine the setting of respective switches within the circuit 10, by connections not shown in FIG. 1 in the interests of clarity. In this example, a word of sixteen bits is expected to be sufficient to fully define the configuration of the circuit 10.

The shift register 70 is provided at one end with a serial data input 72. The circuit 10 can therefore be wholly reconfigured by shifting a new word of bits into the shift register 70, through the input 72. This word can be provided, for instance, from the simulator system 16 as part of the process of setting up the simulation, during which the interface requirements will become apparent.

The shift register 70 is also provided with an output 73 for data leaving the shift register 70 when new data is shifted into the register 70.

Figure 2:
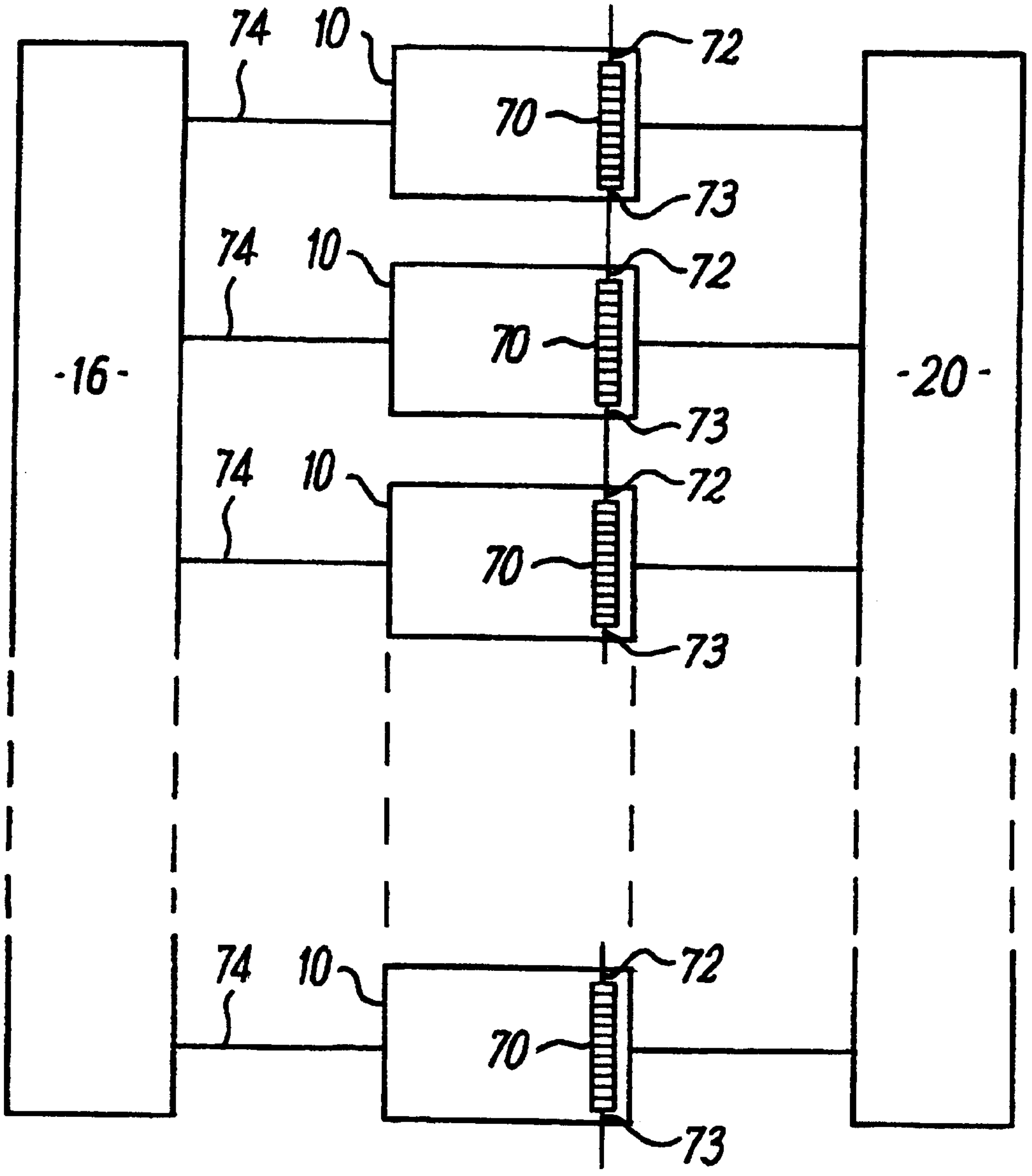
FIG. 2 shows schematically the use of a number of circuits as shown in FIG. 1, to form a multi-channel reconfigurable signal interface system.

The use of a shift register 70 to configure the circuit 10 is particularly advantageous when the circuit 10 forms part of a multi-channel system as illustrated schematically in FIG. 2. In FIG. 2, the simulator 16 has multiple channels 74 each connected to a respective circuit 10. Each circuit 10 provides a respective channel to the system 20.

The shift registers 70 of the line of circuits 10 are illustrated schematically and are seen to be connected in series, with the output 72 of each register 70 providing data to the input 72 of the next register 70 in the line. In effect, the shift registers 70 are connected to form a single longer shift register with an input at the input to the first register in the line, and an output at the output from the register at the opposite end of the line.

This arrangement allows the multiple channels of the system of FIG. 2 to be individually configured by shifting data into the line of shift registers 70 until the data has filled the whole line of registers 70, with each register then containing appropriate data to configure the corresponding circuit 10. Thus, as part of setting of a simulation, a long data word will be written (preferably by software) for shifting into the shift registers 70 as described, to reconfigure the circuits 10 as appropriate, once the required configurations have been decided.

This aspect of the invention could be further expanded by providing the shift registers 70 with sufficient capacity to hold configuration data, as described, and also to hold identification data, such as data identifying the corresponding circuit 10. This could be characteristic data such as a serial number, or data identifying the type of the circuit 10, such as indicating that the circuit did or did not include some of the optional elements such as the filter 28.

This modification would allow the nature of the circuits 10 to be checked prior to the writing of the configuration data, by reading out the entire contents of the line of shift registers 70, and picking out the identifying data from within this line of data. In order to preserve this data (and configuration data) during this operation, it is desirable to recirculate data from the final output of the shift registers to the first input, when data is read in this way.

This facility allows the simulator 16 to ensure that appropriate circuits 10 are available (or to identify the channel in which they are available) before the process of configuring the circuits begins.

It will be apparent that many other arrangements for configuring the circuits could be provided. The use of a shift register is advantageous in view of its simplicity, but programmable logic devices could be used for increased flexibility, for instance.

FIG. 2 illustrates the use of a number of circuits 10 to provide multiple channels. These circuits 10 could be mounted on a common board, for instance by means of industry standard sockets and in one example, sixteen circuits are envisaged mounted on a common board. The board can then be mounted as a single item, by means of conventional mounting arrangements, to provide power and data connections to the circuits 10 and it is envisaged that by using mounting and connection techniques which are conventional in themselves, a very large number of circuits 10 can be conveniently housed in a small space, while remaining each individually configurable quickly and simply, as described. In one example envisaged, a total of sixteen circuits could be mounted on a single card, with seven of these cards being grouped for connection by common connections, and with four such groups forming a rack of circuits, there being seven racks in the total system, which therefore consists of in excess of three thousand individually reconfigurable circuits 10.

It will be apparent from the above description that many variations and modifications can be made within the arrangements described, without departing from the scope of the present invention. In particular, the choice of voltage levels, power levels, component technologies and the like are all widely variable according to the particular applications and range of applications envisaged for the device being constructed. The various switches which configure the circuit are preferably implemented as analogue switches, but many other alternative switch technologies could be used. When the circuit forms part of an array of like circuits, the storage means of the circuits may be connected in parallel, to form a parallel shift register. However, the reconfigurability, and ease of reconfiguration can be retained despite these variations. The circuit could be used solely as an input interface or solely as an output interface.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

What is claimed is:

1. A signal interface circuit comprising circuit portions operable to provide a digital interface, and circuit portions operable to provide an analog interface, the circuit further comprising control means operable selectively to enable or disable the said circuit portions, whereby to reconfigure the interface, and in which the circuit comprises a plurality of switch means operable to reconfigure the interface by connecting and disconnecting corresponding circuit portions, the state of the switch means is determined by data supplied by the control means, and the data is binary data which sets the state of the switch means.

2. A signal interface circuit comprising circuit portions operable to provide a digital interface, and circuit portions operable to provide an analog interface, the circuit further comprising control means operable selectively to enable or disable the said circuit portions, whereby to reconfigure the interface, and in which the circuit comprises a plurality of switch means operable to reconfigure the interface by connecting and disconnecting corresponding circuit portions, the state of the switch means is determined by data supplied by the control means, and the control means comprises storage means storing data bits which set the state of the switch means.

3. A signal interface circuit according to claim 2, in which the storage means comprises a shift register.

4. A signal interface circuit according to claim 2, in which the control means comprises a data input port operable to receive control data for storage in the storage means.

5. A signal interface circuit according to claim 4, in which the data input port is a serial data port.

6. A multi-channel signal interface system comprising an array of signal interface circuits, wherein each signal interface circuit comprises circuit portions operable to provide a digital interface, and circuit portions operable to provide an analog interface, the circuit further comprising control means operable selectively to enable or disable the said circuit portions, whereby to reconfigure the interface, and in which the circuit comprises a plurality of switch means operable to reconfigure the interface by connecting and disconnecting corresponding circuit portions, the state of the switch means is determined by data supplied by the control means, and the control means comprises storage means storing data bits which set the state of the switch means, each signal interface circuit providing a respective interface channel, and wherein the storage means of the circuits are connected in series to allow control data to be passed from circuit to circuit.

7. A multi-channel signal interface system comprising an array of signal interface circuits, wherein each signal interface circuit comprises circuit portions operable to provide a digital interface, and circuit portions operable to provide an analog interface, the circuit further comprising control means operable selectively to enable or disable the said circuit portions, whereby to reconfigure the interface, and in which the circuit comprises a plurality of switch means operable to reconfigure the interface by connecting and disconnecting corresponding circuit portions, the state of the switch means is determined by data supplied by the control means, and the control means comprises storage means storing data bits which set the state of the switch means, each signal interface circuit providing a respective interface channel, and wherein the storage means of the circuits are connected in parallel to allow control data to be passed from circuit to circuit.

8. A signal interface circuit comprising circuit portions operable to provide a digital interface, and circuit portions operable to provide an analog interface, the circuit further comprising control means operable selectively to enable or disable the said circuit portions, whereby to reconfigure the interface, and in which the circuit comprises circuit portions operable to provide an input interface and circuit portions operable to provide an output interface, the circuit comprises portions operable to provide a digital input interface, and the digital input interface includes a threshold detector.

9. A signal interface circuit comprising circuit portions operable to provide a digital interface, and circuit portions operable to provide an analog interface, the circuit further comprising control means operable selectively to enable or disable the said circuit portions, whereby to reconfigure the interface, and in which the circuit comprises circuit portions operable to provide an input interface and circuit portions operable to provide an output interface, the circuit comprises portions operable to provide an analog input interface, the analog input interface comprises a buffer amplifier, and the analog input interface additionally incorporates a variable gain amplifier or a filter circuit.

10. A signal interface circuit comprising circuit portions operable to provide a digital interface, and circuit portions operable to provide an analog interface, the circuit further comprising control means operable selectively to enable or disable the said circuit portions, whereby to reconfigure the interface, and in which the circuit further comprises a load connectable between a terminal on which an input signal is received and a power rail, and the load is connectable selectively to a high or low power rail, whereby to apply a loading to the input signal.

11. A signal interface circuit according to claim 10, in which the voltage of the power rail is selectively configurable to be at one of a plurality of predetermined voltage levels.

12. A signal interface circuit according to claim 11, in which the power rail is configurable in response to data received from the control means.

13. A signal interface circuit comprising circuit portions operable to provide a digital interface, and circuit portions operable to provide an analog interface, the circuit further comprising control means operable selectively to enable or disable the said circuit portions, whereby to reconfigure the interface, and in which the circuit comprises circuit portions operable to provide an input interface and circuit portions operable to provide an output interface, the circuit comprises circuit portions operable to provide a digital output interface to an output terminal, and the circuit portions comprise two switches connected between the output terminal and, respectively, low and high logic levels, the switches being closable to pull the output terminal to the corresponding logic level, the switch to be closed being selected in accordance with the logic level of a signal received.

14. A signal interface circuit according to claim 13, in which the circuit portions further comprise a load connectable between the output terminal and, selectively, the low and high logic levels, to load the output terminal.

15. A signal interface circuit according to claim 13, in which operation of the switches is selectively disabled by the control means, whereby the output is either pulled to a selected logic level or loaded by the load.

16. A signal interface circuit comprising circuit portions operable to provide a digital interface, and circuit portions operable to provide an analog interface, the circuit further comprising control means operable selectively to enable or disable the said circuit portions, whereby to reconfigure the interface, and in which the circuit comprises circuit portions operable to provide an input interface and circuit portions operable to provide an output interface, the circuit comprises circuit portions operable to provide an analog output interface, the analog output interface incorporates an amplifier, such as a buffer amplifier, and the analog output interface additionally incorporates a variable gain amplifier and/or a filter circuit.

* * * * *